US006696205B2

(12) United States Patent
Brooks et al.

(10) Patent No.: US 6,696,205 B2
(45) Date of Patent: Feb. 24, 2004

(54) THIN TANTALUM SILICON COMPOSITE FILM FORMATION AND ANNEALING FOR USE AS ELECTRON PROJECTION SCATTERER

(75) Inventors: Cameron J. Brooks, Elmsford, NY (US); Kenneth C. Racette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 09/745,576

(22) Filed: Dec. 21, 2000

(65) Prior Publication Data

US 2002/0114999 A1 Aug. 22, 2002

(51) Int. Cl.⁷ .............................. G03F 9/00; G03C 5/00
(52) U.S. Cl. ............................................ 430/5; 430/330
(58) Field of Search ....................... 430/5, 322, 323, 430/324, 330; 438/663; 378/34, 35

(56) References Cited

U.S. PATENT DOCUMENTS

| 5,464,711 A | 11/1995 | Mogab et al. |
| 5,500,312 A | 3/1996 | Harriot et al. |
| 5,781,607 A | 7/1998 | Acosta et al. |
| 5,882,826 A | 3/1999 | Kato et al. |
| 5,899,728 A | 5/1999 | Mangat et al. |
| 5,942,760 A | 8/1999 | Thompson et al. |
| 6,381,300 B1 * | 4/2002 | Ezaki .......................... 378/35 |

FOREIGN PATENT DOCUMENTS

| JP | 05003148 | 1/1993 |
| JP | 05061188 | 3/1993 |
| JP | 08264419 | 10/1996 |
| JP | 09281689 | 10/1997 |
| JP | 10070067 | 3/1998 |
| JP | 10229043 | 8/1998 |
| JP | 10270314 | 10/1998 |
| JP | 11233417 | 8/1999 |

OTHER PUBLICATIONS

Intellectual Property Network *for Business*, IBM Technical Disclosure Bulletin, Fabrication of E Beam Projection and X Ray Masks on a Support Frame, Dec. 1977, pp. 2868–2871.

* cited by examiner

Primary Examiner—Mark F. Huff
Assistant Examiner—Saleha R. Mohamedulla
(74) Attorney, Agent, or Firm—DeLio & Peterson, LLC; Kelly M. Reynolds; Richard M. Kotulak

(57) ABSTRACT

A thin transition-metal based scattering layer of a mask blank for use in EPL systems is formed by providing the thin transition-metal scattering layer directly over membrane layers on a lot of substrates, thereby forming a continuous contact between the single transition metal-based scattering layer and the membrane layer. Preferably, the single transition metal-based scattering layer is a single tantalum-silicon composite scattering layer having a stoichiometry of $Ta_xSi$. The deposition parameters for depositing the thin transition-metal based scattering layer are adjusted to provide the scattering layer uniformly over all substrates within the lot. A first substrate from the lot of substrates is then selected, an initial stress measurement of the scattering layer is determined and then the substrate is annealed at a first temperature. The stress of the scattering layer over the first annealed substrate is determined, and subsequently the anneal temperature is adjusted based on a comparison between the pre-anneal, initial stress measurement and the post-annealed stress measurement. A second substrate from the lot of substrates is then selected, annealed at the adjusted temperature, stress measurement of the scattering layer of the second substrate is determined, and the anneal temperature may once again be adjusted. The above process is repeated until a targeted stress level of the thin transition-metal based scattering layer of the mask blank has been obtained. The thin scattering layer is adapted to have final film stress controllable to within ±10% of the targeted stress.

51 Claims, 5 Drawing Sheets

THIN TANTALUM SILICON COMPOSITE FILM FORMATION AND ANNEALING FOR USE AS ELECTRON PROJECTION SCATTERER

STATEMENT AS TO FEDERALLY SPONSORED RESEARCH

This invention was made with U.S. Government support under Agreement No. N00019-99-3-1366 awarded by the Naval Air Systems Command. The U.S. Government has certain rights in the invention.

BACKGROUND OF THE INVENTION

1. Field of the Invention

The present invention relates generally to electron projection lithography (EPL), and more particular, to an apparatus and method for forming a mask blank having a single transition metal-based scattering layer with a final stress state substantially close to a desired final stress for use in lithographic mask formation in EPL systems.

2. Description of Related Art

In modern semiconductor development, semiconductors having decreased feature sizes are increasingly desired, particularly those having feature sizes of 100 nm or smaller. As conventional optical lithographic systems are limited to feature sizes of about 250 nm, one area of focus in developing such modem semiconductors has been to provide lithographic masks with continually decreasing feature sizes while still maintaining the speed, performance, and reliability of the resultant semiconductor.

Utilization of lithographic sources with shorter wavelengths such as x-rays and electron beams provide the potential to meet such feature size requirements of 100 nm or smaller. In x-ray and electron beam lithography (EPL) systems, masks such as membrane masks are required to meet the smaller feature size requirements. The use of membrane masks for x-ray and EPL systems are well known in the art. Typically, the masks are fabricated by depositing a thick absorber layer to a thickness ranging from 300 nm to 1000 nm, or a thin scattering layer for EPL systems to a thickness ranging from 30 nm to 50 nm over a substrate having a thin membrane layer on a surface thereof. The thin membrane layer typically comprises a highly doped silicon, silicon nitride, silicon carbide, diamond or materials as known and used in the art deposited to a thickness of 2–3 microns for use in x-ray lithography and to a thickness of 100–200 nm thick for use in EPL. The x-rays or electron beams pass through the thin membrane layer without significant diffraction or absorption loss.

Electron-beam projection lithography (EPL) systems are well known in the art of semiconductor formation such as SCALPEL and PREVAIL, for example. As illustrated in the prior art EPL mask of FIGS. 1A–B, a mask blank 10 may be provided for forming the mask over the substrate. As illustrated in FIG. 1A, the mask blank 10 may comprise a thin membrane layer 14, followed by an etch stop layer 16 and an overlying scattering layer 18, provided over a substrate surface 12. As will be recognized, the overlying scattering layer may be a multi-film scattering layer or a single film scattering layer.

As illustrated in FIG. 1B, once the absorber or scattering layer has been deposited over the membrane layer on the substrate, a membrane pattern is typically etched through the substrate from the backside using the membrane material as an etch stop, whereby the absorber or scattering layer is then patterned and etched to complete the mask. The absorption or scattering of incident energy by the patterned layer on top of the membrane then gives rise to the image on an underlying substrate coated with photoresist for subsequent device fabrication.

Typically, the scattering layer of the thin mask blanks used in EPL systems are formed over a membrane layer on the substrate by a multi-deposition process of first sputter depositing the etch stop layer over the membrane layer followed by deposition of a scattering layer thereover the etch stop layer. Typically, the etch stop layer comprises a thin chromium film while the scattering layer comprises a tungsten film. In depositing the etch stop and scattering layers of conventional mask blanks used in EPL systems, the multi-layer deposition processes generally require separate targets and separate deposition chambers or tools for the etch stop and scattering layers, whereby the substrate may be required to be moved from one chamber to the next. In depositing the etch stop and scattering layers, the as-deposited stress of the etch stop layer is typically tensile, i.e. positive, while the as-deposited stress of the scattering layer is typically compressive, i.e. negative, resulting in a combined film stack stress of the mask blank being either tensile or compressive. However, in order to obtain sufficient and reliable subsequent pattern placement on the finished mask, it is necessary that the mask blank for use in EPL systems have a combined film stack stress as close to zero as possible for subsequent mask finishing procedures.

In recognizing the above problem, prior art is aimed at controlling both stresses and thicknesses of both the etch stop and scattering layers of the mask blank during deposition procedures to produce a resultant combined film stack having a zero stress state for subsequent pattern placement on the finished mask blank to form a mask for use in EPL systems. However, conventional processes of forming EPL mask blanks also create scattering layer stacks with vertical regions of sharply different stresses, resulting in a final film stack stress of the mask blank varying significantly from substrate to substrate within a single lot of substrates, wherein some stacks possess unacceptable tensile or compressive stresses. As a result of some stacks possessing unacceptable tensile or compressive stresses, subsequent mask finishing procedures result in a final mask having reduced yield requiring additional fabrication steps as well as increased manufacturing times and costs to correct or produce an efficient mask for use in EPL systems.

In controlling the stress of the thick absorber films, prior art is further directed to controlling the stresses in thick absorber layers, such as those thick absorber films for use in x-ray mask, by re-annealing an absorber layer on a single substrate in a two-part annealing process. For example, a two step annealing process for developing and controlling stress in thick absorber films, such as those having thicknesses ranging from 300 nm to 1000 nm, may be used whereby a substrate having a thick absorbing layer is annealed in a first anneal step, the stress of the absorbing layer measured, and subsequently further annealing the same substrate to obtain a near zero stress state of the thick x-ray absorbing scattering layer.

As modern semiconductors continue to decrease in size, and therewith the thin scattering layers of mask blanks for use in EPL systems, a need continues to exist in the art to provide improved methods of making such thin scattering layers for use in the modern, smaller mask blanks for use in EPL systems, whereby the thin scattering layers have as-deposited internal stress states substantially near zero, or alternatively slightly tensile.

Bearing in mind the problems and deficiencies of the prior art, it is therefore an object of the present invention to provide an improved apparatus and method of forming a thin scattering layer for use in an improved mask blank for EPL systems whereby the improved thin scattering layer has a final stress state as near as possible to a desired stress, or stress range, such as stress states substantially close to zero, or alternatively slightly tensile.

It is another object of the present invention to provide an apparatus and method for eliminating the need for a multiple deposition and/or multi-layer deposition process for forming mask blanks for use in EPL systems.

Yet another object of the present invention is to provide a method of forming and a thin scattering layer having a high scattering cross section evident in high atomic number or highly dense materials.

It is another object of the present invention to provide an apparatus and method of forming a thin scattering layer having desirable etch characteristics.

Another object of the present invention is to provide a method of forming and a thin scattering layer having increased control of the final stress states of the thin scattering layer.

Still another object of the present invention is to provide a method of forming and a thin scattering layer whereby stress control is maintained from substrate to substrate in a single lot.

It is another object of the present invention to provide a method of forming and a thin scattering layer having near infinite adjustment of the final stress.

Another object of the present invention is to provide a method of forming and a thin scattering layer free from defects and foreign materials which could render a resultant, final mask useless in device manufacture.

Yet another object of the present invention is to provide a method of forming a thin scattering layer at decreased costs and time.

Still other objects and advantages of the present invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for creating a scattering layer by providing a plurality of substrates, such as semiconductor substrates and silicon substrates, with a scattering layer and controlling stress in the scattering layer by subsequently annealing scattering layers over subsequently selected substrates from the plurality of substrates to an anneal temperature, and adjusting the anneal temperature based on a change in stress measure in the scattering layer over the subsequently selected substrates until the scattering layer stress is stabilized to a desired stress value. Membrane layers may also be directly provided thereover the plurality of substrates, wherein the membrane layers are in direct contact with the scattering layer.

The scattering layer of the present invention may be used in a mask blank for use in EPL. Preferably, the scattering layer is an amorphous or nanocrystalline structure with a high scattering cross section, and even more preferably, the scattering layer is a transition metal-based scattering layer having a stoichiometry of $Ta_xSi$ selected from the group of transition metals having atomic numbers consisting of 21–30, 39–48 and 57–80 over the plurality of substrates. Preferably, the stoichiometry of the present transition metal-based scattering layer is $Ta_2Si$.

The thin transition metal-based scattering layer of the present invention may further include at least another transition metal selected from the group of transition metals having atomic numbers consisting of 21–30, 39–48 and 57–80.

In another aspect of the present invention, the thin transition metal-based scattering layer of the present invention is a binary composite having the molecular formula $A_xB_y$, where A comprises the transition metal, B comprises an element selected from the group of elements consisting of Sc, To, V, Cr, Mn, Fe, Co, Ni, Cu, Zn, Y, Zr, Nb, Mo, Tc, Ru, Rh, Pd, Ag, Cd, La, Hf, Ta, W, Re, Of, Ir, Pt, Au, Hg, B, Al, Ga, In, Tl, C, Si, Ge, Sn, Pb, N, P, As, Sb, Bi, O, S, Se, Te, and Po, and x and y are real numbers representing a number of atoms of each A and B.

In yet another aspect of the present invention, the thin transition metal-based scattering layer of the present invention is a ternary composite having the molecular formula $A_xB_yC_z$ where A comprises the transition metal, B and C each comprise an element selected from the above group of elements, and x, y and z are real numbers representing a number of atoms of each A, B and C.

In still another aspect of the present invention, the thin transition metal-based scattering layer of the present invention may further include oxygen, nitrogen, and combinations thereof.

Preferably the present scattering layer is deposited to a thickness ranging from about 30 nm to about 50 nm by techniques including DC magnetron sputter, DC bipolar sputter, and AC sputter. In depositing the scattering layer, the scattering layers are provided over the plurality of substrates by adjusting deposition parameters to provide reproducible, uniform scattering layers over the plurality of substrates.

Subsequently, the stress of the present scattering layer is controlled by annealing subsequent scattering layers over subsequently selected substrates from the plurality of substrates to an anneal temperature, and adjusting the anneal temperature based on a change in stress measure in the scattering layer over the subsequently selected substrates until the scattering layer stress is stabilized to a desired stress value. In the preferred embodiment, in controlling the stress of the scattering layer by annealing, the anneal temperature may be adjusted to temperatures ranging from about 300° C. to about 500° C. The scattering layers may be annealed for a time ranging from about 5 minutes to about 20 minutes. Preferably, the scattering layer is annealed by a vertical tube furnace rapid thermal annealing system. Once the final anneal temperature is determined, all remaining substrates of the plurality of substrates may be annealed at the final anneal temperature to provide scattering layers over remaining ones of the plurality of substrates with the desired internal stress state. Preferably the final film stress is controlled to within ±10 Mpa of the targeted stress.

The present invention further includes allowing the substrates having the scattering layers at the desired internal stress state to equilibrate until an internal stress of the scattering layers are stabilized to a desired target.

In a further aspect of forming the present scattering layer, a first substrate stress is determined by measuring a first substrate bow, cleaning a surface of the substrate, providing the scattering layers over the cleaned substrate surface, measuring a second substrate bow, and then determining the first substrate stress by calculating a difference between the first substrate bow and the second substrate bow. Alternatively, the surface of the substrate may be cleaned before the first substrate bow is measured.

In the preferred embodiment, the present invention provides a method for creating a scattering layer by providing a plurality of substrates, providing scattering layers thereover the substrates, determining a desired internal stress state of the scattering layers, and then controlling stress in the scattering layers over the plurality of substrates by the following steps:

a) annealing a first substrate from the plurality of substrates having the scattering layers thereover at a first anneal temperature;

b) measuring an internal stress of the scattering layer over the first substrate;

c) determining a second anneal temperature based on the internal stress of the scattering layer over the first substrate;

d) annealing a second substrate from the plurality of substrates at the second anneal temperature;

e) measuring an internal stress of the scattering layer over the second substrate; and f) repeating steps a)–e) until a final anneal temperature is determined at which the stress in the scattering layers is at the desired internal stress state of the scattering layers.

In such an embodiment, once the final anneal temperature has been determined, all remaining ones of the plurality of substrates at the final anneal temperature to obtain scattering layers over the remaining ones of the plurality of substrates having the desired internal stress state may be annealed at the such final temperature.

In another aspect, the present invention provides a method for creating a mask blank comprising providing the plurality of substrates; providing a membrane layer over the plurality of substrates; and then providing scattering layers over the plurality of substrates, the scattering layers having stress controlled by subsequently annealing scattering layers over subsequently selected substrates from the plurality of substrates to an anneal temperature and adjusting the anneal temperature based on a change in a stress measure in the scattering layer over the subsequently selected substrates until the stress in the scattering layer is stabilized to a desired stress value. Preferably, the membrane layer comprises a material selected from the group consisting of silicon nitride, silicon carbide, and diamond, deposited to a thickness of about 50 nm to about 200 nm.

In yet another aspect, the present invention provides a mask blank for electron projection lithography comprising a substrate, a membrane layer directly over the substrate, and a transition metal-based scattering layer directly over the membrane layer, the transition metal-based scattering layer having an internal stress at a desired stress value.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
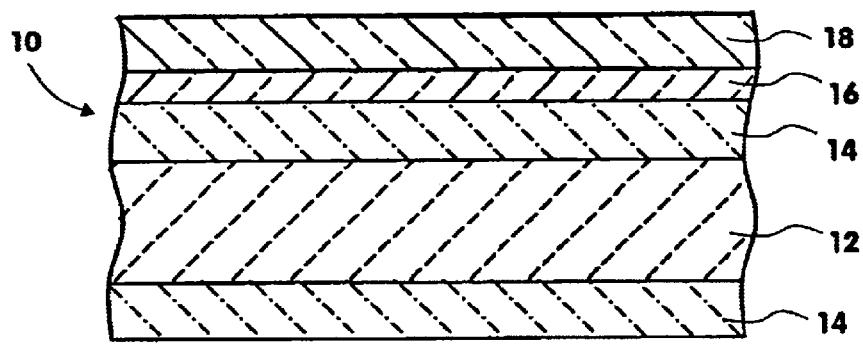
FIG. 1A is a cross-sectional illustration of a conventional mask blank over a substrate for use in mask formation in EPL systems.
Figure 1B:
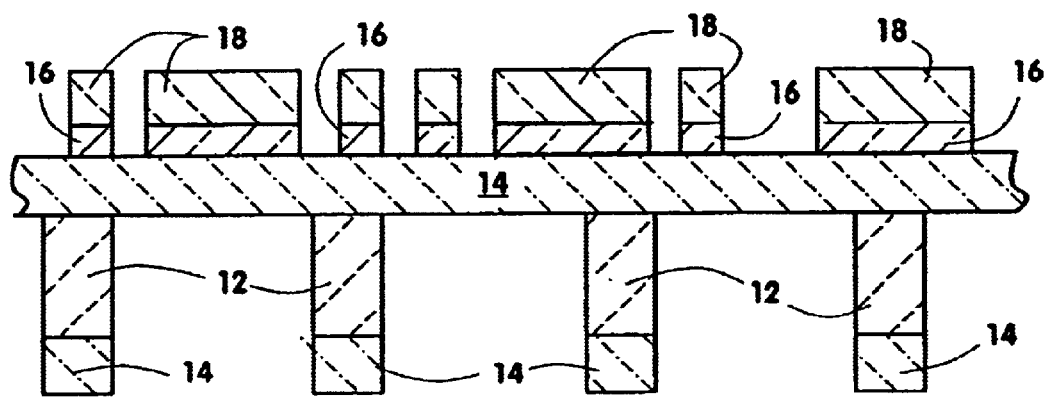
FIG. 1B is a cross-sectional illustration of a patterned EPL mask over the substrate formed by using the conventional mask blank of FIG. 1A.

In describing the preferred embodiment of the present invention, reference will be made herein to FIGS. 1–4 of the drawings in which like numerals refer to like features of the invention. Features of the invention are not necessarily shown to scale in the drawings.

In the present invention, it has been recognized that known procedures of controlling stresses and thicknesses of both the conventional etch stop and scattering layers of the mask blank during deposition procedures to produce a resultant combined film stack having a zero stress state does not produce stable thin scattering layers having a film stack stress of zero. A film stack stress of zero is not achieved in thin films as a result of the film stresses being dependent upon a variety of factors including, for example, substrate surface conditions, deposition parameters, and contamination of the layers by foreign materials during transferring the substrates from one deposition tool to the next.

Figure 3A:
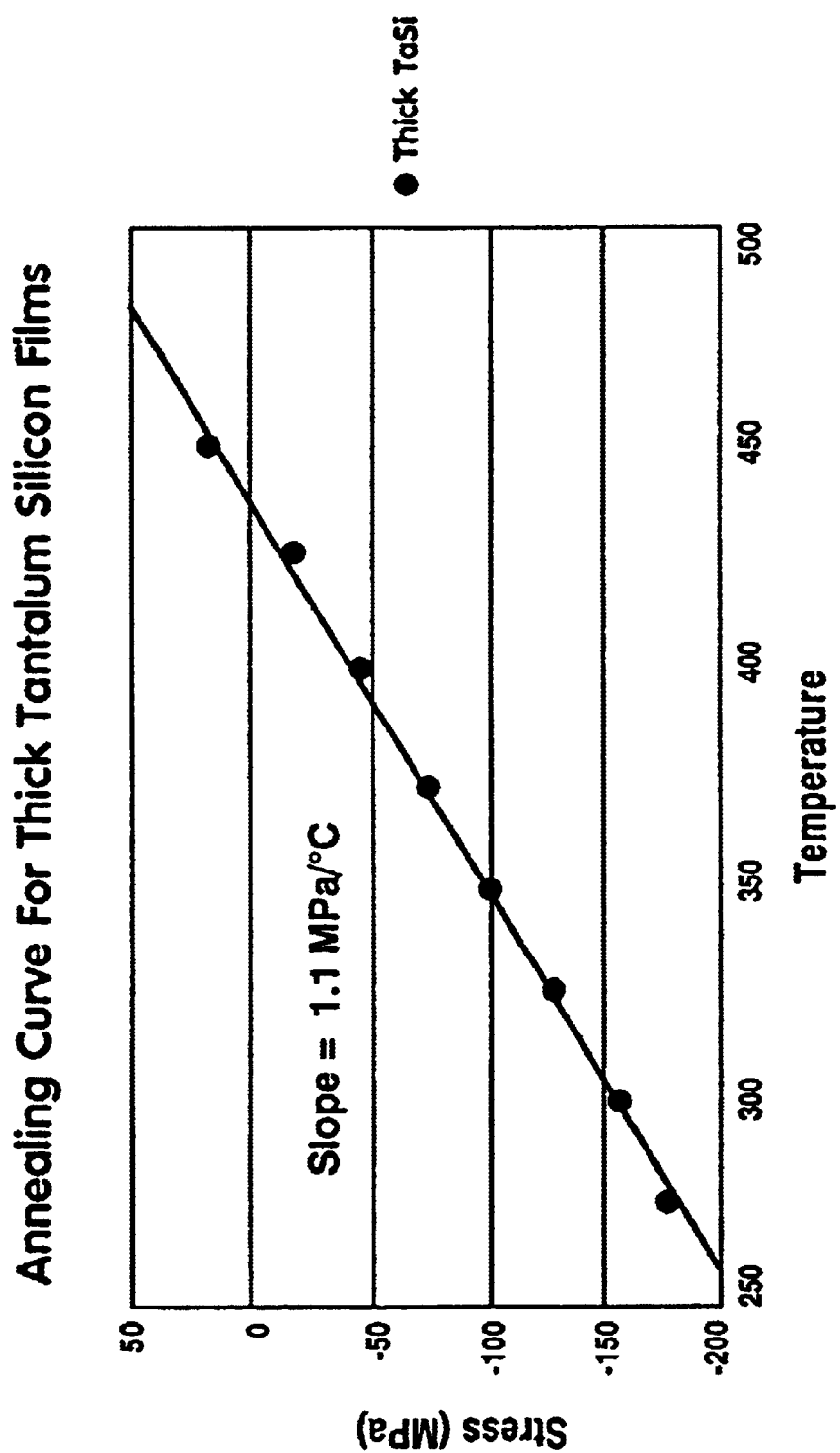
FIG. 3A illustrates an annealing curve for thick tantalum silicon layers.
Figure 3B:
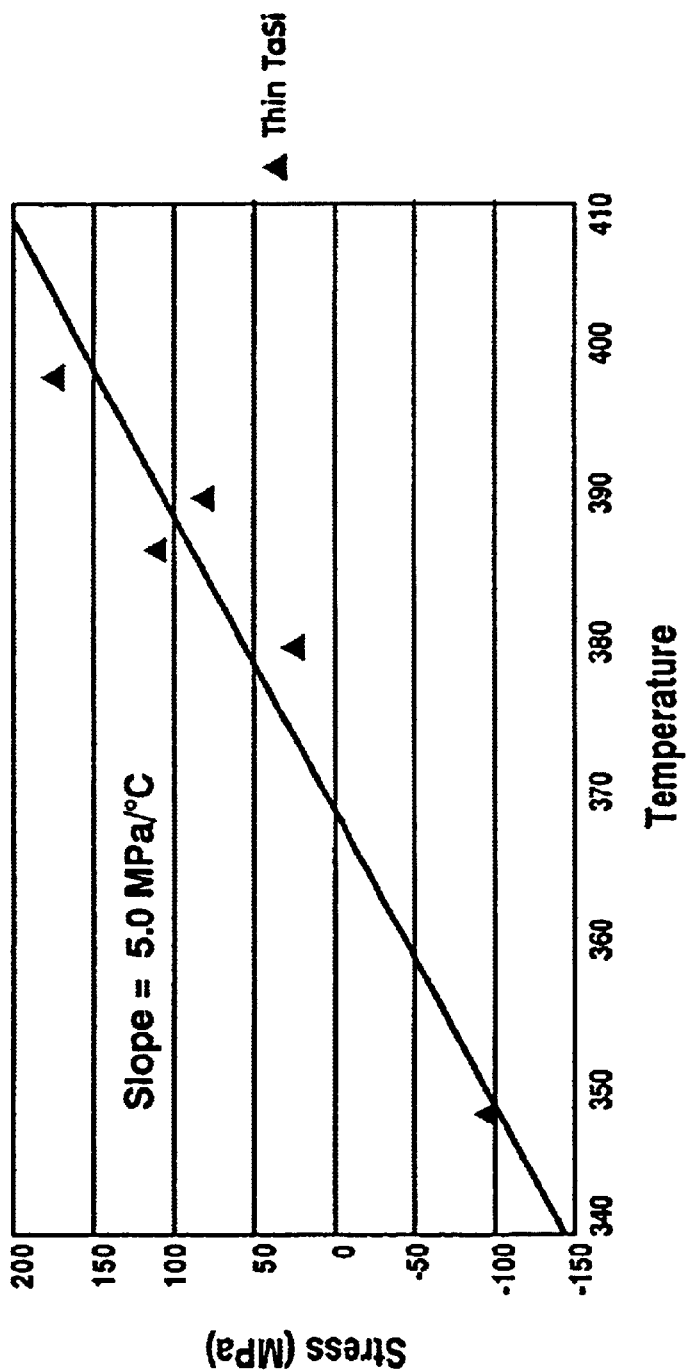
FIG. 3B illustrates an annealing curve for thin tantalum silicon layers showing differences between changes in internal stress states of thin scatter layer due to changing anneal temperatures and the changes in internal stress states of thick scattering layers due changing anneal temperatures as shown in FIG. 3A.

It has also been recognized that known two-part annealing processes of the same lithographic mask, such as those for developing thick scattering films by annealing a substrate, measuring the substrate stress, and subsequently re-annealing the same substrate to obtain a near zero stress state do not produce thin scattering layers having stable stress and/or stable stress control. Stable thin scattering layers are not produced as a result of the as-deposited internal stress of the thin scattering layers being more compressive, from about −600 Mpa to about −800 Mpa compressive, than the as-deposited stress of thick absorbing layers which range from about −100 Mpa to about −200 Mpa compressive. Further, the change of internal stress states of the thin scatter layers associated with changing annealing temperature is greater than the change of internal stress states of the thick absorbing layers. As illustrated in the annealing curves of FIGS. 3A–B, under conditions of changing annealing temperatures the conventional thin scattering layers have an increased change in internal stress in comparison to the internal stress changes of the thick absorbing layers. As illustrated in FIG. 3A, conventional thick absorbing layers typically exhibit a change in internal stress of about 1–2 Mpa per degree Celcius in the tensile direction, whereas in FIG. 3B the thin scattering layers exhibit a change in internal stress of about 3–7 Mpa per degree Celcius in the tensile direction.

In re-annealing the thin substrates using conventional two-step annealing procedures, it has also been recognized that it is difficult to estimate and/or obtain a desired targeted stress of the re-annealed thin scattering layer. In annealing the thin scatter layer in the first anneal step, the as-deposited compressive stress state of the thin scatter layer moves in the tensile direction toward a more stable stress state of the thin scatter layer. Subsequently, in subjecting the annealed thin scatter layer to the second annealing step, the internal stress of the scattering layer may reverse and move back towards a more compressive stress level. Once the thin scatter layer is subjected to the second anneal, subsequent annealing procedures will not make the film more tensile to correct for compressive stress. Also, after the thin scatter layer has been subjected to the second anneal process, the thin scatter layers must stabilize over a period of time during which the thin scatter layers exhibit a change in stress state in the compressive direction, thus making the resultant annealed thin scatter layers even more compressive.

In the development of thin scattering layers, it is advantageous to obtain as near as possible to a desired stress, or to a desired stress range, in as few steps as possible. Therefore, conventional two step anneal processes are not advantageous in forming thin scattering layers for use in thin mask blanks which exhibit good etchability for sub-micron mask patterning, minimum grain size, film uniformity, minimum film thickness, formation of volatile etch components, good sidewall passivation, and decreased contaminants. Furthermore, the use of conventional multiple deposition chambers and steps for depositing multi-layer scattering film stacks results in poor stress control, increased defects, variation of properties from substrate to substrate, poor yield, longer manufacturing times, increased cost, and poor quality masks are also not advantageous for formation of thin scatter films for use in mask blanks for use in EPL systems.

As such, the present invention is directed to a method and apparatus for forming a thin scattering layer of a mask blank with as-deposited internal stress states as close to zero as possible for use in mask fabrication in EPL systems. In the present method and apparatus of forming the thin scattering layer of the mask blank, the mask blank comprises the thin scattering layer directly thereover a membrane layer over the substrate. The thin scattering layer is adapted to have final film stress controllable to within ±10% of a targeted stress by subsequently annealing differing substrates having the thin scattering layer over surfaces thereof in separate annealing processes at varying annealing temperatures. The annealing temperatures are adjusted based on stress measurements of subsequently annealed thin scattering layers. Therein, selected ones of substrates from a single lot of substrates having the thin scattering layers thereover are annealed one at a time at varying temperatures until a final anneal temperature has been obtained. Once the final anneal temperature has been obtained, all remaining substrates within the lot of substrates may be annealed at the final anneal temperature to provide the thin scattering layers of the remaining substrates with stress states substantially near the targeted stress.

In the preferred embodiment, the thin scattering layer comprises a pure transition metal, or an alloyed transition metal, which is adapted by annealing to provide a final stress state of the scattering layer substantially near zero. Preferably, the mask is for use in EPL systems including SCALPEL, PREVAIL, Stencil, and the like, but may also be used in any lithographic system requiring thin films, as will be recognized. Alternatively, the present mask blank may be used in EUV systems to improve pattern placement of subsequent patterns on the single layered scattering mask. The single transition metal-based scattering layer of the mask blank may be deposited as a thin film over a plurality of substrates within the single lot having membrane layers over surfaces thereof. Preferably, the single transition metal-based scattering layer comprises a single tantalum-silicon composite scattering layer which may be tantalum rich, or alternatively tantalum poor. The single transition metal-based scattering layer is deposited directly over the membrane layer to form a continuous contact between the single transition metal-based scattering layer and the membrane layer, thereby filling any gaps between such scattering and membrane layers, and forming a mask blank for use in EPL systems. Therein, the present invention avoids and eliminates the use and need of an etch stop layer between the scattering and membrane layers.

After the single transition metal-based scattering layers of the mask blanks have been deposited over the substrates within the single lot, initial as-deposited internal stress states of the transition metal-based scattering layers are measured and an average of such measurements is calculated. Subsequently, a first substrate is selected from the lot of substrates and annealed at a first anneal temperature. The stress state of the annealed transition metal-based scattering layers on the first substrate is measured and the anneal temperature is corrected using the measured stress state of the annealed scattering layer on the first substrate and the initial as-deposited internal stress state measurement to determine a second anneal temperature. Next, a second substrate is selected from the lot of substrates and annealed at the second anneal temperature. The stress state of the transition metal-based scattering layers on the second substrate is measured and the second anneal temperature is corrected using the measured stress state of the scatter layer on the second substrate to determine a third anneal temperature. The present invention allows for infinite adjustments of the anneal temperature by following the temperature anneal adjustment steps, as discussed above and further below, until a desired stress state of the transition metal-based scattering layers of the mask blanks within the single lot is reached, or alternatively to within ±10 Mpa of the desired stress state. All remaining substrates within the lot are then annealed at the final anneal temperature to provide the scattering layers of the mask blanks on the remaining substrates with the desired stress state, or alternatively to within ±10 Mpa of the desired stress state. Subsequently, the single transition metal-based scattering layers at the desired stress state are allowed to equilibrate until stabilized, or until the stress no longer changes.

Thus, the present mask blank for use in EPL systems comprises the annealed single transition metal-based scattering layer having improved stress relief directly in contact with the membrane layer of the mask blank, thereby eliminating the need for a double scattering layer, such as a chromium etch stop layer and a tungsten scattering layer. The present invention provides a single, scattering layer of the mask blank and thereby simplifies the resultant scattering stack and reduces defects in the resultant mask formed using the mask blank of the present invention. As the scattering layer of the mask blank of the present invention is a single scattering layer only one composite target and deposition chamber are required, thereby avoiding contact with and exposure to the air and environment outside the chamber during the deposition process. Further, in depositing the scattering film of the present invention by one target within one deposition chamber, surface contamination of the scattering layer of the mask blank by foreign contaminants, water, native oxygen, or other gases is avoided as the film is moved from chamber to chamber or tool to tool. Thereby the present mask blank provides a cleaner mask blank thereby decreasing defects in the final, resultant mask which is formed using the present mask blank. Further, better stress and material property control is achieved as a result of only one film deposition being controlled.

The advantages of the invention will be better understood following a description of the preferred embodiment of the present invention. In accordance with the preferred embodiment, a plurality of substrates within a first lot are provided as a starting material in forming the present transition metal-based scattering layer of the present mask blank for use in forming masks in EPL systems. The substrates may comprise semiconductor materials as known and used in the art including, for example, silicon. Further, the substrates may be selected from a plurality of substrates having varying diameters such as 100 mm, 150 mm, and 200 mm, and the like. In the preferred embodiment, a first lot of twenty-five (25) silicon substrates may be used as the starting material in forming the present transition metal-based scattering layer of the present mask blank.

Membrane layers are then formed over the substrates within the first lot. The membrane layers may be formed over a first side of the substrate, or alternatively over both sides of the substrates. In the preferred embodiment, the membrane layers are formed over both sides of the substrates by providing a material including silicon nitride, silicon carbide, diamond, and the like, over the substrates within the first lot and coating first and second surfaces of the substrates with the membrane material to form the membrane layer portions of the finished masks on the first lot of silicon substrates. The membrane layers are provided thereover surfaces of the substrates by techniques as known and used in the art including low pressure chemical vapor deposition (LPCVD), sputtering or microwave chemical vapor deposition. Preferably, the membrane portions are provided over the substrates using a conventional external supplier including, for example, low pressure chemical vapor deposition for silicon nitride and silicon carbide depositions, microwave chemical vapor deposition for diamond deposition, and varying other sputter deposition techniques as known and used in the art. In the preferred embodiment, the membrane film may comprise silicon nitride, silicon carbide, or diamond uniformly deposited over both surfaces of the substrates to a thickness ranging from about 50 nm to about 200 nm, having an as-deposited internal tensile stress state ranging from about 100 Mpa to about 200 Mpa. More preferably, the membrane layer comprises silicon nitride deposited by LPCVD to a thickness ranging from about 100 nm to about 150 nm having an as-deposited internal stress ranging from about 50 Mpa to about 150 Mpa.

Subsequently, an initial, pre-scattering layer stress level of each substrate within the first lot, having membrane layers over surfaces thereof, are measured using conventional stress measurement systems including, for example, a Flexus 5510 stress measurement system manufactured by KLA-Tencor of San Jose, Calif. In doing so, each substrate within the first lot is first measured to determine an initial, pre-scattering layer substrate bow, or shape, needed for determining a stress measurement. After determining the initial substrate bow, but prior to deposition of the scattering layer of the present invention over the lot of substrates, each substrate is pre-treated to minimize substrate-to-substrate surface variation by cleaning and/or planarizing the substrate surface. In the preferred embodiment, the substrate may be pre-treated to minimize substrate-to-substrate surface variation using known techniques including, for example, chemical cleaning and/or plasma etching such as an argon plasma etchant. Subsequently the single transition metal-based scattering layer of the present invention is deposited over the substrates having minimal substrate to substrate surface variation using reproducible deposition parameters, thereby providing the lot of substrates with a scattering layer having uniform stress from substrate to substrate. After the single transition metal-based scattering layer of the present invention has been deposited over the substrates, a post-scattering layer substrate bow measurement is taken, preferably by the above discussed techniques. An initial stress measurement of the single transition metal-based scattering layer ($S_i$) over the substrate is then determined by known techniques including calculating the difference between the pre-scattering layer substrate bow measurement and the post-scattering layer substrate bow measurement of each substrate.

Figure 4:
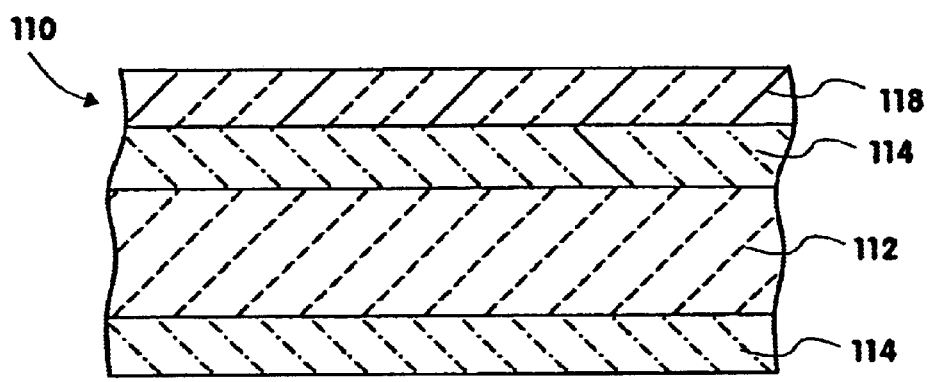
FIG. 4 is a cross-sectional illustration of the mask blank of the present invention having a scattering layer directly over a membrane layer thereover a substrate wherein the scattering layer has a final stress state substantially close to a desired final stress for use in lithographic mask formation in EPL systems.

As illustrated in FIG. 4, the mask blank 110 of the present invention comprises a substrate 112 having the membrane layer over first and second sides of the substrate 112. The single transition metal-based scattering layer 118 is deposited directly thereover the first side of the substrate having the membrane layer 114 whereby the scattering layer is in direct contact with the membrane layer 114 on the first side of the substrate. The scattering layer is a thin, uniform, smooth scattering layer in direct contact with the membrane layer whereby the deposition parameters have been adjusted to provide repeatable substrate to substrate stresses of the deposited scattering layer. In the preferred embodiment, the single transition metal-based scattering layer is deposited directly thereover the membrane layers on the first side of the substrates to a thickness ranging from about 30 nm to about 50 nm, preferably to about 40 nm. The deposited single transition metal-based scattering layer of the present invention forms an amorphous or nanocrystalline structure having a high scattering cross section.

The single transition metal-based scattering layer may be deposited by a variety of techniques as known and used in the art including dc magnetron sputtering, AC sputtering, dc bipolar sputtering, Rf sputter, and the like, to create a uniform, thin transition metal-based scattering layer having specific desired properties. Preferably, the single transition metal-based composite film is deposited by a composite sputtering target within a single chamber whereby the deposition parameters provide repeatable substrate to substrate stresses of the deposited scattering layer for the subsequent annealing steps of the present invention. As will be recognized by one skilled in the art, the deposition parameters may be adjusted by techniques as known and used in the art including selection of the specific processes and conditions including varying deposition gas pressure and/or power, varying the Rf or anode bias, varying deposition times, and the like. Thus, selection of the specific processes and conditions provides flexibility in obtaining reproducible transition metal-based scattering layer stress states, compositions, densities, deposition uniformity, and atomic compositions as will be recognized. For example, decreasing gas flow or pressure results in denser films with more compressive stress.

The single transition metal-based scattering film of the present invention may comprise a pure transition metal, or alternatively, an alloy comprising a transition metal in combination with at least one of the elements selected from Groups IIIA, IVA, and VB, another transition metal, or combinations thereof, to create composites including binary, ternary, and the like. In forming, for example, the binary or ternary composites of the present invention, a transition metal selected from the transition metals having atomic numbers 21–30, 39–48 and 57–80 may be combined with at least one of the elements selected from B, AL, Ga, In, and Tl in Group IIIA; C, Si, Ge, Sn, and Pb in Group IVA; N, P, As, Sb, and Bi in Group VA; and O, S, Se, Te, and Po in Group VIA, another transition metal selected from the above transition metals, or combinations thereof to form the binary or ternary composites having the general molecular formula $A_xB_yC_z$ where A, B, and C are elements from the above lists, and x, y, and z are real numbers representing the number of atoms of each element. The binary or ternary composite targets used in the deposition of the present thin scattering layer of the present mask blank may be formed by techniques as known and used in the art, such as hot isostatic pressing mixtures of transition metal powder with another transition metal powder, for example. Thus, the appropriate selection of pure transition metal or composite targets allows the formation of a single scattering layer comprising either a pure, thin transition metal scattering layer, or alternatively alloyed binary or ternary thin, composite transition metal-based scattering layers.

Preferably, the thin layer of transition metal-based scattering layer of the present thin mask blank comprises a tantalum silicon composite scattering layer. The tantalum silicon composite scattering layer is deposited over the membrane layer on the substrate by dc magnetron sputter deposition from tantalum silicon composite sputtering targets having a composition of $TaSi_{0.6}$ to a thickness ranging from about 30 nm to about 50 nm, preferably to about 40 nm. The lot of substrates having the membrane layers thereover are held within a conventional holding means, as known and used in the art, and are then provided within a single deposition chamber for depositing the thin tantalum silicon composite scattering layers over the membrane layers. The single deposition chamber eliminates the need to move the lot of substrates from one chamber to the next thus avoiding exposing the substrates to foreign contaminants and preventing contamination of the single layer of the thin transition metal-based scattering layer.

In the preferred embodiment, the composite sputtering target for formation of the thin transition metal-based scattering layer provides an intimate mixture of tantalum and silicon by hot isostatic pressing of mixed tantalum and silicon powders. The lot of substrates are held within a holder, such as a 25 substrate cassette, and then are provided within a conventional one chamber deposition system, or alternatively one chamber of a multi-chamber deposition system. Preferably, the adjusted deposition conditions for providing repeatable substrate to substrate stresses of the deposited scattering layer include dc power at about 5000 watts, argon gas flow of about 6 sccm, and a deposition time of about 10 seconds, wherein heat, anode bias, and Rf bias are not provided in the single deposition chamber during depositing the single layer of the thin transition metal-based scattering layer over the substrates. The substrates are then provided with the reproducible single layer of transition metal-based scattering layer one-at-a-time whereby the substrates are automatically handled and loaded from the 25 substrate cassette using techniques and apparatus as known and used in the art, thereby maximizing substrate-to-substrate uniformity of thickness and stress for efficient and effective subsequent annealing procedures.

The composite thin transition metal-based scattering layers of the present invention formed by the above target compositions are not tantalum silicide ($TaSi_2$) compounds, but intimate mixtures of tantalum and silicon having a preferred stoichiometry of $Ta_2Si$ with a high scattering cross-section. However, as will be recognized, in alternate embodiments of the present invention various other tantalum rich or tantalum poor composites may be formed by appropriate modifications of target composition and process conditions. In such embodiments, the single layer tantalum-silicon composite scattering layer of the mask blank is preferably either tantalum rich or tantalum poor, whereby the tantalum-silicon composite has a stoichiometry of $Ta_xSi$. In a tantalum rich tantalum-silicon composite the stoichiometry is $Ta_xSi$, with x being any number greater than 0.5, or $Ta_{>0.5}Si$. In a tantalum poor tantalum-silicon composite the stoichiometry is also $Ta_xSi$, with x being any number less than 0.5, or $Ta_{<0.5}Si$. Preferably, the single tantalum-silicon composite is tantalum rich, based on the atomic ratio, as tantalum rich composites provide greater electron beam scattering cross sections and thus are generally better for use as scattering layers within a mask blank for EPL systems than tantalum poor composites.

Alternatively, oxygen, nitrogen, or combinations thereof, may be added to the single transition metal-based scattering layer of the mask blank, either before or after deposition of the transition metal-based scattering layer in order to make the scattering layer more amorphous for etching. The addition of oxygen, nitrogen, and combinations thereof also assist in the adjustment of the as-deposited stress, film uniformity, and conductivity. The oxygen and nitrogen may be added to the single scattering layer of pure transition metal or the single transition metal-based composite scattering layer as additional film constituents. In the preferred embodiment of adding oxygen, nitrogen, and combinations thereof to the scattering layer, wherein the transition metal-based scattering layer comprises the single tantalum-silicon composite scattering layer, the molecular formula of such an embodiment may comprise $Ta_wSi_xO_y$, $Ta_wSi_xN$, and $Ta_wSi_xO_yN_z$, wherein w, x, y, and z are real numbers representing the number of atoms of each element. The oxygen, nitrogen, or combinations thereof, may be added during the sputtering processes, such as by reactive gas sputtering, whereby the single layer transition metal composite having the oxygen, nitrogen, or combinations thereof, is deposited over the membrane film as described above. Alternatively as will be recognized, the oxygen, nitrogen, or combinations thereof, may be added to the film during a subsequent annealing process by annealing the films in air or an oxygen or nitrogen rich atmosphere. The addition of oxygen, nitrogen, or combinations thereof to the present single thin scattering layer may be beneficial in reducing the tensile stress of those single scattering layers which may have been annealed at too high a temperature.

After deposition of the thin, single layer of transition metal-based scattering layer, the film will possess as-deposited compressive stress. In the preferred embodiment, the as-deposited tantalum silicon stress states of compressive may be increased by subsequently annealing the single transition metal-based scattering layer to achieve a zero stress state, or alternatively a slightly tensile stress state ranging from about +0 Mpa to about +25 Mpa. In the present invention, the thin transition metal-based scattering film is annealed by adjusting the anneal temperatures based on any measured stress changes of the initial as-deposited stress of the single transition metal-based scattering layer ($S_i$) in comparison to the as-deposited stress of the thin transition metal-based scattering film of consecutively annealed substrates selected from the lot of substrates. In the preferred embodiment, after the single transition metal-based scattering layer has been deposited over the lot of substrates and the initial as-deposited stress of the single transition metal-based scattering layer ($S_i$) has been determined, the as-deposited stress of the substrates may be controlled by adjusting annealing temperatures based on stress measurements of scattering layers of subsequently annealed substrates from within the lot of substrates. In the preferred embodiment, wherein the single transition metal-based scattering layer is deposited to a thickness of about 40 nm over the substrate, the initial as-deposited stress of the single transition metal-based scattering layer ($S_i$) may range from about 725 MPa to about 775 Mpa in a given deposition run, batch, and/or single lot of substrates. From run-to-run the as-deposited stress may vary between −600 Mpa to about −800 Mpa.

The thin transition metal-based scattering film may be annealed using techniques and apparatus as known and used in the art including, for example, rapid thermal annealing systems, ovens, vertical tube furnaces or other rapid thermal processing systems known and used in the art. In the preferred embodiment, annealing is performed in a vertical tube furnace at temperatures ranging from about 300° C. to about 500° C. for a duration of about 5 minutes to about 20 minutes, preferably for about 10 minutes. In the vertical tube furnace, the substrate may be raised or lowered inside the furnace by means of an elevator thereby precisely controlling the height or distance of the substrates to a heating element of the furnace, therein controlling the annealing temperature to within ±1° C. as well as controlling an across substrate temperature uniformity of within ±1° C. to assure good annealing uniformity. Furthermore, the annealing is preferably performed in an ambient atmosphere of argon, nitrogen, or combinations thereof. The atmosphere, temperature, and gas flow rate for annealing the thin transition metal-based scattering film may be controlled by techniques as known and used in vertical tube furnace rapid thermal systems. Precise control of ambient atmosphere, furnace temperature, purge gas flow rate and elevator height allows tailoring of final films stress to desired value with excellent stress uniformity across the substrate. The use of vertical tube furnace rapid thermal processing systems provides a unique control of annealing variables to assure improved stress control of thin scatter layers for use in EPL, particularly those having thin films ranging in thickness from about 30 nm to about 50 nm.

In annealing the substrates to obtain a final stress level of zero or slightly tensile of the present scattering layer, a first substrate is selected from the lot of substrates having the membrane layer directly in contact with the single transition metal-based scattering layers having the initial as-deposited stress of the single transition metal-based scattering layer ($S_i$). After the first substrate from the lot of substrates has been selected, an initial substrate annealing temperature ($T_1$) is selected for annealing the first substrate. The initial annealing temperature is based on the measurement of the initial as-deposited stress of the single transition metal-based scattering layer ($S_i$), whereby the initial annealing temperature ($T_1$) correlates to a desired stress level of the single tantalum-silicon composite scattering film, such as 60 MPa, for example. The initial annealing temperature may be selected or determined using techniques as known and used in the art, including selecting a temperature from a range of temperatures of previously annealed substrates, or alternatively selecting an estimated temperature at which as-deposited stresses may be close to the desired stress. In the preferred embodiment, the initial anneal temperature for annealing the thin tantalum silicon scattering layer over the membrane silicon nitride layers of the present mask blank ranges from about 300° C. to about 500° C., more preferably from about 375° C. to about 400° C. The first substrate selected from the lot of substrates having the thin transition metal-based scattering layer is then provided into the annealing furnace and annealed for a time of about 10 minutes at the initial substrate annealing temperature ($T_1$). Subsequently, the substrate is cooled and then removed from the annealing furnace whereby a stress of the annealed thin transition metal-based scattering layer is then re-measured using the above discussed stress measurement systems to obtain a first annealed stress level ($S_1$). In the present invention, wherein the first anneal stress measurement ($S_1$) is within about ±10 Mpa of a targeted stress level ($S_T$), all remaining substrates within the first lot may be annealed at the initial substrate annealing temperature ($T_1$), thereby providing all remaining thin transition metal-based scattering layers over the membrane layers of the mask blanks within the first lot with a scattering layer stress level within about ±10 Mpa of the targeted stress level ($S_T$). Preferably, the targeted stress level ($S_T$) of the thin transition metal-based scattering layer is zero stress, or optionally slightly tensile stress.

Alternatively, wherein the first anneal stress measurement ($S_1$) of the thin transition ($S_T$) metal-based scattering layer is not within about 10 Mpa of the targeted stress level, the first substrate selected from the lot of substrates comprises a first test substrate and subsequently a second test substrate may be selected from the lot of substrates as well as determining a second substrate annealing temperature ($T_2$). The second substrate annealing temperature ($T_2$) is determined by a corrected annealing temperature ($T_C$) calculated using, for example, the following equation:

$$T_c = \frac{S_T - S_1 \text{ MPa}}{X \text{ MPa}/°C.} \qquad \text{(Equation 1)}$$

wherein the corrected anneal temperature ($T_C$) is derived by dividing the difference between the target stress ($S_T$) and the first anneal stress measurement ($S_1$) by the approximate change in stress per degree Celcius (X) for the deposited thin transition metal-based scattering layer over the membrane layers. In the preferred embodiment, the approximate change in stress per degree Celcius (X) for the thin tantalum silicon films over silicon nitride layers is about 6 Mpa per degree Celcius. Subsequently, the corrected anneal temperature ($T_C$) is added to the first substrate annealing temperature ($T_1$) to obtain the second substrate annealing temperature ($T_2$), wherein:

$$T_2 = T_1 + T_C \qquad \text{(Equation 2)}$$

Next, the second test substrate selected from the lot of substrates is provided within the annealing furnace using known techniques and subsequently annealed at the second substrate annealing temperature ($T_2$). The second test substrate having the thin transition metal-based scattering layer over the membrane layers is preferably annealed for about 10 minutes at the second substrate annealing temperature ($T_2$). The stress of the annealed thin transition metal-based scattering layer over the membrane layers of the second test substrate is then measured using the above discussed steps to obtain a second annealed stress level ($S_2$). Wherein the second anneal stress measurement ($S_2$) is within about 10 Mpa of the targeted stress level ($S_T$), all remaining substrates within the first lot may be annealed at the corrected, second substrate annealing temperature ($T_2$) thereby providing the remaining substrates within the lot with a thin transition metal-based scattering layer, directly over the membrane layer, having a stress level within about 10 Mpa of the targeted stress level ($S_T$). As will be recognized, if the annealed stress of the second substrate does not fall within 10 Mpa of the target stress limits, a third corrected annealing temperature ($T_3$) is determined and a third substrate is annealed by the above steps. Alternatively, the above steps may be repeated until the annealed stress of the thin transition metal-based scattering layer of the annealed substrate is within 10 Mpa of the target stress limits. Once the correct annealing temperature is obtained, all remaining substrates within the first lot are then annealed to provide the substrates with a thin transition metal-based scattering layer within 10 Mpa of the target stress limits. In the present invention, annealing all remaining substrates within the lot at the correct annealing temperature to obtain the thin transition metal-based scattering layer with a zero or slightly tensile, or desired stress is possible as a result of the substrates having similar initial as-deposited stress due to the deposition parameters being controlled and/or adjusted to provide a reproducible scattering layer with similar as-deposited stress states.

Figure 2:
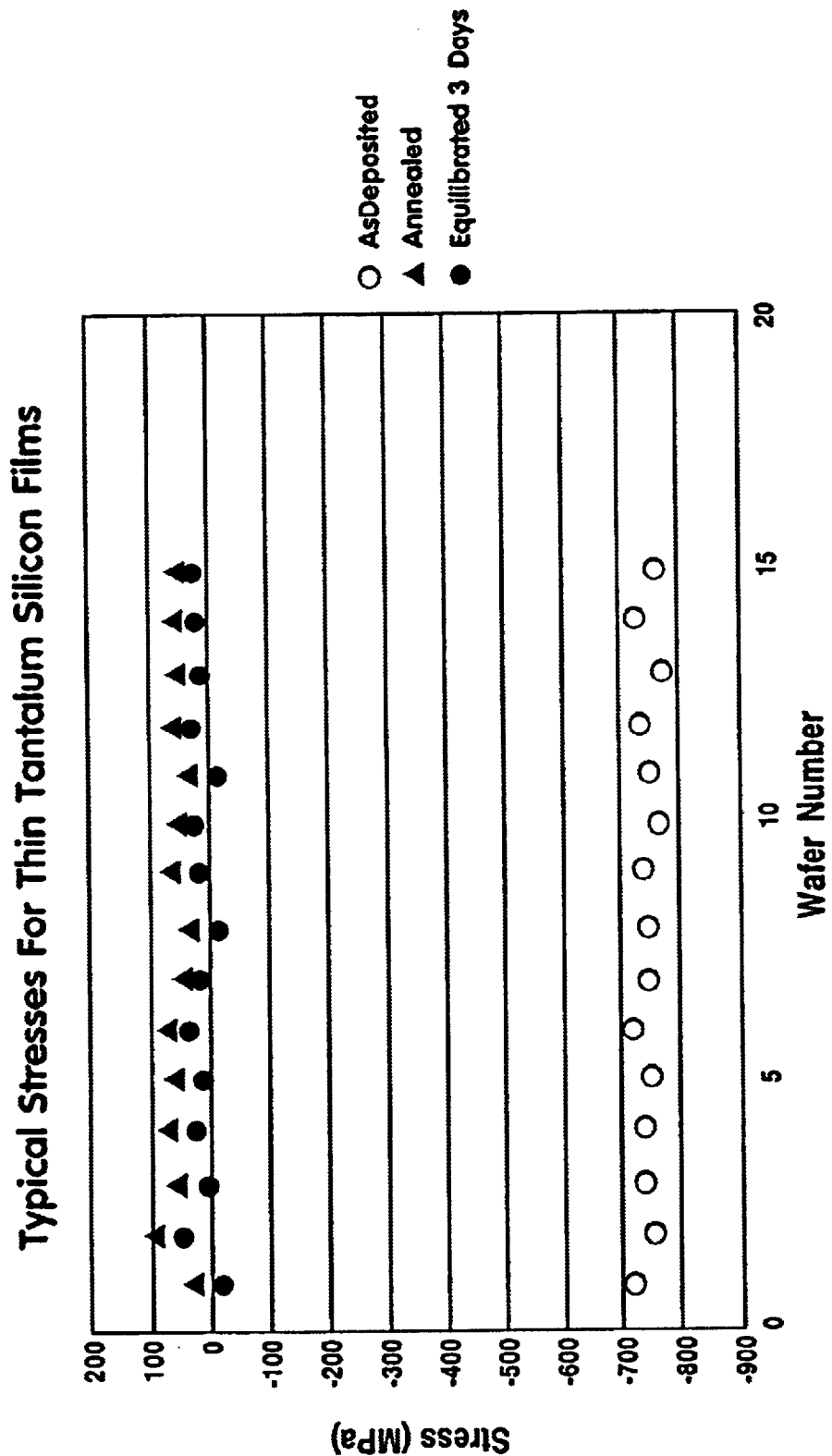
FIG. 2 is a graphical data presentation of the as-deposited stress and the annealed stress values for a typical lot of thin tantalum silicon scattering layer.

For example, as illustrated in FIG. 2, a lot of fifteen (15) substrates were provided with the membrane layer followed by the thin transition metal-based scattering layer thereover. The initial as-deposited stresses of the thin transition metal-based scattering layer over the substrates were measured and an initial average of the as-deposited stress of −743 Mpa was obtained. Subsequently, the first substrate was annealed at a temperature of about 380° C. and then the annealed thin transition metal-based scattering layer stress of the second substrate was measured. An annealed thin transition metal-based scattering layer stress of about 32 Mpa was obtained, which is lower than the target value of 50 Mpa. Next, the second substrate was annealed at a temperature of about 391° C. and then the annealed thin transition metal-based scattering layer stress of the second substrate was measured. An annealed thin transition metal-based scattering layer stress of about 105 Mpa was obtained, which is higher than the target value. A third substrate was then annealed at about 385° C. and exhibited a stress of about 49 Mpa, which is considerably close to the target value of 50 Mpa. The remaining substrates within the lot having the thin transition metal-based scattering layer thereover were then annealed at the temperature of about 385° C. The annealed stresses of the thin transition metal-based scattering layer over the remaining thirteen (13) substrates were then measured and an average annealed stress for the 13 substrates annealed at about 385° C. was 51 Mpa and the average equilibrated stress for these substrates was about 16 Mpa, as further discussed below.

Alternatively, individual temperatures may be calculated for each substrate within a lot wherein the individual temperatures are determined based on differences in the measurements of the as-deposited stresses from the annealed stresses of the first, second, third, to an "$n^{th}$" number test substrates. Such an embodiment may provide further improvement in the substrate to substrate final stress uniformity.

Furthermore, once the thin transition metal-based scattering layer having the final stress within about ±10 Mpa of the target stress limits has been obtained, the substrate and final thin transition metal-based scattering layer over the membrane layer are allowed to equilibrate for a period of time ranging from about 3 days to about 7 days in a sealed container. Alternatively, the entire substrate lot may be allowed to equilibrate for a period of time with the stress of the thin scattering films being measured each day until there is no change from one day to the next whereby the scatterer film stack formation is complete. While equilibrating, the stress of the annealed thin transition metal-based scattering layer may slowly change in a compressive direction such as, for example, at a magnitude of about 35 Mpa to about 45 Mpa positive for the thin tantalum-silicon scattering layers of the preferred embodiment over a three day period. As a result, the target final stress for the above annealing process may be selected at an increased stress level, such as an increased stress level of about 35 Mpa to about 45 Mpa more positive than the desired final stress of the thin tantalum-silicon scattering layers of the preferred embodiment. Additionally, the target for the desired final stress of the thin transition metal-based scattering layer, prior to equilibrium, may also be set at an increased stress level, such as an increased stress level of about 50 Mpa for the thin tantalum-silicon scattering layers. Therein providing a margin of error to assure slight tensile stress without creating films that are too highly stressed and thus not efficient or useful. The test substrates used to determine correct annealing temperature may then be discarded or alternatively used as test substrates in subsequent mask fabrication steps.

In the present invention, the scattering layer is equilibrated until the internal stresses of the single transition metal-based scattering layer are stabilized to the proper compressive value, such as zero, for example. Thus, the stress of the single transition metal-based scattering layer film of the present invention is controlled and monitored by annealing the film under controlled anneal conditions including anneal gases and gas pressures, and anneal temperatures and time. In annealing the single transition metal-based scattering film, the final film stress is controllable to within substantially close proximity of the desired stress level. The resultant, annealed single transition metal-based scattering layer film having improved, controllable stress levels further provides improved ease of subsequent processing steps of the substrate such as, for example, improved etching properties for sub-micron mask patterning including minimal grain size due to the nanocrystalline structure, film uniformity, minimum film thickness, formation of subsequent volatile etch compounds, subsequent good sidewall passivation, and decreased contaminants. Furthermore, the use of depositing the single, thin scattering layer in a single chamber provides improved stress control, decreased defects, minimal variation of properties from substrate to substrate, improved yield, decreased manufacturing times, decreased costs, and improved quality for use in mask blanks for EPL systems.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for creating a scattering layer comprising:
   providing a plurality of substrates;
   providing scattering layers over said plurality of substrates; and
   controlling stress in said scattering layers by subsequently annealing scattering layers over sequentially selected substrates from said plurality of substrates to an anneal temperature and adjusting the anneal temperature based on a change in a stress measure of said scattering layers between said sequentially selected and annealed substrates until said stress in said scattering layers is stabilized to a desired stress value.

2. The method of claim 1 said scattering layer comprises an amorphous structure.

3. The method of claim 1 said scattering layer comprises a nanocrystalline structure.

4. The method of claim 1 wherein said scattering layer comprises a transition metal-based scattering layer.

5. The method of claim 4 wherein said transition metal-based scattering layer further comprises at least another transition metal.

6. The method of claim 4 wherein said transition metal-based scattering layer comprises a binary composite.

7. The method of claim 4 wherein said transition metal-based scattering layer comprises a ternary composite.

8. The method according to claim 1 wherein said scattering layer is deposited to a thickness ranging from about 30 nm to about 50 nm.

9. The method according to claim 1 wherein said scattering layer is deposited by sputter deposition including DC magnetron sputter, DC bipolar sputter, and AC sputter.

10. The method according to claim 1 wherein said scattering layer is annealed at the adjusted temperatures ranging from about 300° C. to about 500° C.

11. The method according to claim 1 wherein said scattering layer is annealed for a time ranging from 5 minutes to about 20 minutes.

12. The method according to claim 1 wherein said scattering layer is annealed by a vertical tube furnace rapid thermal annealing system.

13. The method according to claim 1 further including equilibrating said substrates having said scattering layers at said desired internal stress state until an internal stress of said scattering layers are stabilized to a desired target.

14. The method according to claim 1 wherein said scattering layers over said plurality of substrates is deposited by adjusting deposition parameters to provide reproducible, uniform scattering layers over said plurality of substrates.

15. The method of claim 1 wherein said scattering layer comprises a scattering layer in a mask blank for use in EPL.

16. A method for creating a scattering layer comprising:
providing a plurality of substrates;
providing a transition metal-based scattering layer selected from the group of transition metals having atomic numbers consisting of 21–30, 39–48 and 57–80 over said plurality of substrates; and
controlling stress in said transition metal-based scattering layer by subsequently annealing transition metal-based scattering layer over sequentially selected substrates from said plurality of substrates to an anneal temperature and adjusting the anneal temperature based on a change in a stress measure of said transition metal-based scattering layers between said sequentially selected and annealed substrates until said stress in said scattering layer is stabilized to a desired stress value.

17. The method of claim 16 wherein said transition metal-based scattering layer further comprises at least another transition metal selected from the group of transition metals having atomic numbers consisting of 21–30, 39–48 and 57–80.

18. The method of claim 16 wherein said transition metal-based scattering layer further comprises at least one element selected from the group consisting of B, Al, Ga, In, Tl, C, Si, Ge, Sn, Pb, N, P, As, Sb, Bi, O, S, Se, Te, and Po.

19. The method of claim 16 wherein said transition metal-based scattering layer comprises a binary composite having the molecular formula $A_xB_y$ where A comprises said transition metal, B comprises an element selected from the group consisting of Sc, To, V, Cr, Mn, Fe, Co, Ni, Cu, Zn, Y, Zr, Nb, Mo, Tc, Ru, Rh, Pd, Ag, Cd, La, Hf, Ta, W, Re, Of, Ir, Pt, Au, Hg, B, Al, Ga, In, Tl, C, Si, Ge, Sn, Pb, N, P, As, Sb, Bi, O, S, Se, Te, and Po, and x and y are real numbers representing a number of atoms of each A and B.

20. The method of claim 16 wherein said transition metal-based scattering layer comprises a ternary composite having the molecular formula $A_xB_yC_z$ where A comprises said transition metal, B and C each comprise an element selected from the group consisting of Sc, To, V, Cr, Mn, Fe, Co, Ni, Cu, Zn, Y, Zr, Nb, Mo, Tc, Ru, Rh, Pd, Ag, Cd, La, Hf, Ta, W, Re, Of, Ir, Pt, Au, Hg, B, Al, Ga, In, Tl, C, Si, Ge, Sn, Pb, N, P, As, Sb, Bi, O, S, Se, Te, and Po, and x, y and z are real numbers representing a number of atoms of each A, B and C.

21. The method according to claim 16 wherein said transition metal-based scattering layer is deposited to a thickness ranging from about 30 nm to about 50 nm.

22. The method according to claim 16 further including providing a membrane layer directly thereover said plurality of substrates, said membrane layer being in direct contact with said transition metal-based scattering layer.

23. The method of claim 16 wherein said transition metal-based scattering layer comprises a tantalum silicon scattering layer having a stoichiometry of $Ta_xSi$.

24. The method of claim 23 wherein said scattering layer comprises a scattering layer having a stoichiometry of $Ta_2Si$.

25. The method of claim 16 further including providing oxygen, nitrogen, and combinations thereof, to said transition metal-based scattering layer.

26. A method for creating a scattering layer comprising:
providing a plurality of substrates;
providing scattering layers over said plurality of substrates;
determining a desired internal stress state of said scattering layers;
controlling stress in said scattering layers over said plurality of substrates by:
a) annealing a first substrate from said plurality of substrates having said scattering layers thereover at a first anneal temperature,
b) measuring an internal stress of said scattering layer over said first substrate,
c) determining a second anneal temperature based on said internal stress of said scattering layer over said first substrate,
d) annealing a second substrate from said plurality of substrates at said second anneal temperature,
e) measuring an internal stress of said scattering layer over said second substrate; and
repeating steps a)–e) until a final anneal temperature is determined at which said stress in said scattering layers is at said desired internal stress state of said scattering layers.

27. The method of claim 26 further including the step of annealing remaining ones of said plurality of substrates at said final anneal temperature to obtain scattering layers over said remaining ones of said plurality of substrates having said desired internal stress state.

28. The method of claim 26 further including the step of equilibrating the substrates until a stress in said substrates having said scattering layers at said desired internal stress state is stabilized to a proper compressive value.

29. A method for creating a mask blank comprising:

providing a plurality of substrates;

providing a membrane layer over said plurality of substrates; and providing scattering layers over said plurality of substrates, said scattering layers having stress controlled by subsequently annealing scattering layers over sequentially selected substrates from said plurality of substrates to an anneal temperature and adjusting the anneal temperature based on a change in a stress measure of said scattering layers between said sequentially selected and annealed substrates until said stress in said scattering layer is stabilized to a desired stress value.

30. The method according to claim 29 wherein said substrate comprises a semiconductor substrate.

31. The method according to claim 29 wherein said membrane layer comprises a material selected from the group consisting of silicon nitride, silicon carbide, and diamond.

32. The method according to claim 29 wherein said membrane layer is deposited to a thickness of about 50 nm to about 200 nm.

33. The method according to claim 29 wherein said substrate comprises a silicon substrate.

34. A method for creating a scattering layer comprising:

providing a plurality of substrates;

providing scattering layers over said plurality of substrates;

controlling stress in said scattering layers by subsequently annealing scattering layers over subsequently selected substrates from said plurality of substrates to an anneal temperature and adjusting the anneal temperature based on a change in a stress measure in said scattering layer over said subsequently selected substrates until said stress in said scattering layers is stabilized to a desired stress value; and annealing remaining substrates of said plurality of substrates at a final anneal temperature to provide scattering layers over said remaining ones of said plurality of substrates with said desired internal stress state.

35. The method of claim 34 said scattering layer comprises an amorphous structure.

36. The method of claim 34 said scattering layer comprises a nanocrystalline structure.

37. The method of claim 34 wherein said scattering layer comprises a transition metal-based scattering layer.

38. The method of claim wherein said transition metal-based scattering layer further comprises at least another transition metal.

39. The method of claim 37 wherein said transition metal-based scattering layer comprises a binary composite.

40. The method of claim 39 wherein said binary composite has a molecular formula $A_xB_y$ where A comprises said transition metal, B comprises an element selected from the group consisting of Sc, To, V, Cr, Mn, Fe, Ca, Ni, Cu, Zn, Y, Zr, Nb, Mo, Tc, Ru, Rh, Pd, Ag, Cd, La, Hf, Ta, W, Re, Of, Ir, Pt, Au, Hg, B, Al, Ga, In, Tl, C, Si, Ge, Sn, Pb, N, P, As, Sb, Bi, O, S, Se, Te, and Po, and x and y are real numbers representing a number of atoms of each A and B.

41. The method of claim 37 wherein said transition metal-based scattering layer comprises a ternary composite.

42. The method of claim 41 wherein said ternary composite has a molecular formula $A_xB_yC_z$ where A comprises said transition metal, B and C each comprise an element selected from the group consisting of Sc, To, V, Cr, Mn, Fe, Co, Ni, Cu, Zn, Y, Zr, Nb, Mo, Tc, Ru, Rh, Pd, Ag, Cd, La, Hf, Ta, W, Re, Of, Ir, Pt, Au, Hg, B, Al, Ga, In, Tl, C, Si, Ge, Sn, Pb, N, P, As, Sb, Bi, O, S, Se, Te, and Po, and x, y and z are real numbers representing a number of atoms of each A, B and C.

43. The method according to claim 34 wherein said scattering layer is deposited to a thickness ranging from about 30 nm to about 50 nm.

44. The method according to claim 34 wherein said scattering layer is deposited by sputter deposition including DC magnetron sputter, DC bipolar sputter, and AC sputter.

45. The method according to claim 34 wherein said scattering layer is annealed at the adjusted temperatures ranging from about 300° C. to about 500° C.

46. The method according to claim 34 wherein said scattering layer is annealed for a time ranging from 5 minutes to about 20 minutes.

47. The method according to claim 34 further including equilibrating said substrates having said scattering layers at said desired internal stress state until an internal stress of said scattering layers are stabilized to a desired target.

48. A method for creating a scattering layer comprising:

providing a plurality of substrates;

cleaning a surface of said plurality of substrates;

measuring a first substrate bow of at least a first substrate selected from said plurality of substrates;

providing scattering layers over said cleaned surfaces of said plurality of substrates; and controlling stress in said scattering layers by subsequently annealing scattering layers over subsequently selected substrates from said plurality of substrates to an anneal temperature and adjusting the anneal temperature based on a change in a stress measure in said scattering layer over said subsequently selected substrates until said stress in said scattering layers is stabilized to a desired stress value, wherein said change in stress measure is determined by the steps of:

measuring a second substrate bow of said at least first substrate selected from said annealed plurality of substrates, calculating a difference between said first substrate bow and said second substrate bow.

49. The method according to claim 48 wherein said first substrate stress is determined before subsequently annealing said scattering layers over subsequently selected substrates from said plurality of substrates.

50. The method according to claim 48 wherein said step of measuring said first substrate bow is prior to said step of cleaning said surface of said substrate.

51. The method according to claim 48 wherein said step of cleaning said surface of said substrate is prior to said step of measuring said first substrate bow.

* * * * *